United States Patent
Wojtczak et al.

(10) Patent No.: US 6,599,870 B2
(45) Date of Patent: Jul. 29, 2003

(54) BORIC ACID CONTAINING COMPOSITIONS FOR STRIPPING RESIDUES FROM SEMICONDUCTOR SUBSTRATES

(75) Inventors: William A. Wojtczak, San Jose, CA (US); George Guan, San Jose, CA (US); Long Nguyen, Milpitas, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/179,867

(22) Filed: Jun. 25, 2002

(65) Prior Publication Data

US 2003/0040447 A1 Feb. 27, 2003

Related U.S. Application Data

(62) Division of application No. 09/801,543, filed on Mar. 7, 2001, now Pat. No. 6,492,310, which is a continuation of application No. 09/312,933, filed on May 17, 1999, now Pat. No. 6,306,807.
(60) Provisional application No. 60/085,879, filed on May 18, 1998.

(51) Int. Cl.$^7$ .............................. C11D 7/10; B08B 3/04
(52) U.S. Cl. ................... 510/175; 510/176; 510/178
(58) Field of Search ................. 510/175, 176, 510/178; 252/33.4, 400.53, 106, 142; 514/383

(56) References Cited

U.S. PATENT DOCUMENTS

| 3,719,598 A | | 3/1973 | King ........................... 252/33.4 |
|---|---|---|---|
| 4,259,206 A | * | 3/1981 | Piotrowski et al. ........... 508/478 |
| 4,759,872 A | | 7/1988 | Marx et al. .............. 252/400.53 |
| 5,391,234 A | * | 2/1995 | Murphy ........................ 134/38 |
| 5,468,412 A | * | 11/1995 | Rodzewich ................... 510/258 |
| 5,714,507 A | | 2/1998 | Valcke et al. ................ 514/383 |
| 5,916,356 A | | 6/1999 | Williams et al. .......... 106/18.32 |
| 5,972,862 A | | 10/1999 | Torii et al. |
| 6,306,807 B1 | * | 10/2001 | Wojtczak et al. ............ 510/175 |

FOREIGN PATENT DOCUMENTS

| CA | 1161026 | 1/1984 |
|---|---|---|
| DE | 130420 A | 3/1978 |
| JP | 1143715 | 6/1986 |

* cited by examiner

Primary Examiner—Gregory E. Webb
(74) Attorney, Agent, or Firm—Margaret Chappuis; Steven J. Hultquist

(57) ABSTRACT

The present invention comprises formulations for stripping wafer residues which originate from a halogen based plasma metal etching followed by oxygen plasma ashing. The formulations contain the following general components (percentages are by weight):

| Boric Acid | 2–17% |
|---|---|
| Organic amine or mixture of amines | 35–70% |
| Water | 20–45% |
| Glycol solvent (optional) | 0–5% |
| Chelating agent (optional) | 0–17% |

The preferred amines are:

Monoethanolamine (MEA)
Triethanolamine (TEA).

19 Claims, No Drawings

BORIC ACID CONTAINING COMPOSITIONS FOR STRIPPING RESIDUES FROM SEMICONDUCTOR SUBSTRATES

CROSS REFERENCE TO RELATED APPLICATION

This application is a division of U.S. application Ser. No. 09/801,543, filed on Mar. 7, 2001 now U.S. Pat. No. 6,492,310; now-pending, which is a continuation of U.S. application Ser. No. 09/312,933 filed on May 17, 1999, now U.S. Pat. No. 6,306,807, which claims priority to U.S. provisional application Serial No. 60/085,879 filed on May 18, 1998.

BACKGROUND OF THE INVENTION

1. Field of the Invention

The present invention relates generally to chemical formulations used in semiconductor wafer fabrication and particularly to chemical formulations, including at least boric acid and one or more organic amines and water, that are utilized to remove residue from wafers following a resist plasma ashing step.

2. Description of the Prior Art

The prior art teaches the utilization of various chemical formulations to remove residue and clean wafers following a photoresist ashing step. Generally, these prior art chemical formulations include strong reagents such as strong acids or strong bases to help remove unwanted inorganic residues. However, such strong reagents can cause unwanted further removal of metal or insulator layers remaining on the wafer and are therefore undesirable in many instances. There is therefore a need for chemical formulations which effectively remove residue following a resist ashing step which do not attack and potentially degrade delicate structures which are meant to remain on a wafer.

SUMMARY OF THE INVENTION

The present invention comprises formulations for stripping wafer residues which originate from a halogen based plasma metal etching followed by oxygen plasma ashing. The formulations contain the following general components (percentages are by weight):

| | |
|---|---|
| Boric Acid | 2–17% |
| Organic amine or mixture of amines | 35–70% |
| Water | 20–45% |
| Glycol solvent (optional) | 0–5% |
| Chelating agent (optional) | 0–17% |
| The preferred amines are: | |
| Monoethanolamine (MEA) | |
| Triethanolamine (TEA) | |

It is an advantage of the present invention that it effectively removes inorganic residues following a plasma ashing step.

It is another advantage of the present invention that it effectively removes metal halide and metal oxide residues following plasma ashing.

It is a further advantage of the present invention that it effectively removes inorganic residue from a semiconductor wafer following plasma ashing without containing a strong acid or a strong base.

These and other features and advantages of the present invention will become understood to those of ordinary skill in the art upon review of the following detailed description of the preferred embodiments.

DETAILED DESCRIPTION OF THE PREFERRED EMBODIMENTS

Typical steps in the fabrication of semiconductor wafers involve the creation of metalized layers or insulating layers having patterned resist layers formed thereon. Such a wafer may then be exposed to plasmas (such as halogen based plasmas) to remove exposed metal or insulator. Thereafter, a plasma ashing step is conducted (typically using an oxygen based plasma) in which the remaining resist is removed from the wafer. The result is a patterned metal layer or a patterned insulator layer.

This series of steps generally results in a residue which must be removed from the wafer prior to further fabrication steps. The residue following the plasma ashing step is predominantly composed of inorganic compounds such as metal halides and metal oxides.

Various chemical formulations are currently used to remove the inorganic compound residues. These formulations are generally holdovers from older semiconductor fabrication wet chemical resist removal processes that were used prior to the introduction of the resist plasma ashing technology. The prior formulations thus typically contain strong acids or strong bases to remove residues. The present invention comprises chemical formulations for the removal of inorganic compound residues, where the formulations do not contain the strong acids or strong bases of the prior art formulations.

The present invention comprises new formulations for stripping wafer residues which originate from high density plasma metal etching followed by plasma ashing. The formulations contain boric acid, one or more amines and water or another solvent as primary ingredients with a glycol solvent and/or a chelating agent as optional ingredients.

The preferred formulations utilize the following general components percentages are by weight):

| | |
|---|---|
| Boric Acid | 2–17% |
| Organic amine or mixture of amines | 35–70% |
| Water | 20–45% |
| Glycol solvent (optional) | 0–5% |
| Chelating agent (optional) | 0–17% |
| The preferred amines are: | |
| Monoethanolamine (MEA) | |
| Triethanolamine (TEA) | |

The utilization of boric acid in combination with amines is a unique feature of this invention. These formulations provided good stripping performance which can be enhanced by the addition of optional chelating agents and solvents.

The chelating agents are preferably weakly to moderately acidic and contain combinations of two functional groups which include carboxylic acids, aromatic hydroxyl groups, amides, ketones, and aldehydes such that the two groups in the chelating agent are in close proximity to each other.

Preferred chelating agents are:

| | |
|---|---|
| Catechol | $C_6H_4(OH)_2$ |
| Lactic acid | $CH_3CH(OH)CO_2H$ |

Other acceptable chelating agents are:

| | |
|---|---|
| Acetoacetamide | $CH_3COCH_2CONH_2$ |
| Salicylaldehyde | $2\text{-}(HO)C_6H_4CHO$ |

Examples of preferred formulations are:

| | |
|---|---|
| Boric acid | 17% |
| Monoethanolamine | 45% |
| Water | 32% |
| Catechol | 6% |
| Boric acid | 15% |
| Monoethanolamine | 43% |
| Water | 34.8% |
| Lactic acid | 6.2% |
| Boric acid | 10% |
| Triethanolamine | 38% |
| Water | 35% |
| Acetoacetamide | 17% |
| Boric acid | 15% |
| Monoethanolamine | 35% |
| Water | 35% |
| Salicylaldehyde | 15% |
| Boric acid | 15% |
| Monoethanolamine | 40% |
| Water | 45% |
| Boric acid | 12% |
| Monoethanolamine | 45% |
| Triethanolamine | 10% |
| Water | 33% |
| Boric acid | 17% |
| Monoethanolamine | 40% |
| Water | 38% |
| Ethylene Glycol | 5% |

The inventors expect that other closely related ingredients would be expected to show comparable performance to those utilized in the preferred formulations.

These include:

A. Other organic amines are expected to be suitable:

B. Other glycol solvents are expected to be suitable.

C. Other chelating agents which are also weakly to moderately acidic and are structurally similar to those claimed are also expected to be suitable.

D. It would also be expected that inclusion of optional components such as surfactants, stabilizers, corrosion inhibitors, buffering agents, and cosolvents would constitute obvious additions to those practiced in the art.

The formulations of the present invention are particularly useful on wafers which have been etched with chlorine- or fluorine-containing plasmas followed by oxygen plasma ashing. The residues generated by this type of processing typically contain inorganic materials such as, but not limited to, aluminum oxide and titanium oxide. These residues are often difficult to dissolve completely without causing corrosion of metal and titanium nitride features required for effective device performance.

EXAMPLES

Two types of commercially generated wafers containing vias were evaluated using the formulations of the present invention. In each case, following plasma etching and ashing the residue was removed from the wafer by immersion of the wafer in a formulation bath at 50°–60° for 30 minutes followed by washing with deionized water and drying with a stream of nitrogen gas. It is expected by the inventors that the formulations can also be applied by spraying onto the wafers in an automated spray tool followed by a water rinse.

Example 1

A wafer having 1.6 micron diameter, three layer vias comprised of a titanium nitride top layer (40 nm thick), a second layer of silicon oxide (1.3 microns thick), and a bottom layer of aluminum/copper alloy. The substrate was silicon oxide.

Example 2

A wafer having one micron diameter, three layer vias comprised of a silicon oxide top layer (7000 angstroms thick), a second layer of titanium nitride (1200 angstroms thick), and a bottom layer of aluminum. The substrate was silicon oxide.

All of the preferred formulations identified above were tested on the wafers of both Example 1 and Example 2. Other formulations within the range of components given above were also tested.

The formulations were rated for relative stripping effectiveness and corrosivity. The preferred formulations scored best and, in overall performance based on both stripping effectiveness and low corrosivity, are approximately equal.

While the present invention has been shown and described with reference to particular preferred embodiments, it is to be understood that other and further changes and modifications of the invention will become apparent to those skilled in the art after understanding the present invention. It is therefore intended that the following claims cover all such alterations and modifications as fall within the true spirit and scope of the invention.

We claim:

1. A semiconductor wafer cleaning formulation for use in post plasma ashing semiconductor fabrication consisting essentially of the following components in the percentage by weight ranges shown:

| | |
|---|---|
| Boric acid | 2–17% |
| At least one amine | 35–70% |
| Water | 20–45% |
| Glycol solvent | 0–5% |
| Chelating agent | 0–17%. |

2. A cleaning formulation as described in claim 1 including a said glycol solvent, having a percentage by weight range not exceeding 5%.

3. A cleaning formulation as described in claim 1 including a said chelating agent, having a percentage by weight range not exceeding 17%.

4. A cleaning formulation as described in claim 2 including a said chelating agent, having a percentage by weight range not exceeding 17%.

5. A cleaning formulation as described in claim 1 wherein said amine is selected from the group consisting of:

Monoethanolamine (MEA)

Triethanolamine (TEA).

6. A cleaning formulation as described in claim 2 wherein said amine is selected from the group consisting of:

Monoethanolamine (MEA)

Triethanolamine (TEA).

7. A cleaning formulation as described in claim 3 wherein said amine is selected from the group consisting of:

Monoethanolamine (MEA)

Triethanolamine (TEA).

8. A cleaning formulation as described in claim 4 wherein said amine is selected from the group consisting of:

Monoethanolamine (MEA)

Triethanolamine (TEA).

9. A cleaning formulation as described in claim 3 wherein said chelating agent is selected from the group consisting of:

Catechol

Lactic acid

Acetoacetamide

Salicylaldehyde.

10. A cleaning formulation as described in claim 4 wherein said chelating agent is selected from the group consisting of:

Catechol

Lactic acid

Acetoacetamide

Salicylaldehyde.

11. A cleaning formulation as described in claim 9 further including one or more of the compounds selected from the group consisting of surfactants, stabilizers, corrosion inhibitors, buffering agents, and cosolvents.

12. A cleaning formulation for post etch and plasma ashing cleaning of semiconductor wafers, consisting essentially of 10 to 17% by weight boric acid, 35 to 45% by weight of at least one amine, 32 to 45% by weight of water, 0 to 5% by weight glycol solvent, and 0 to 17% by weight chelating agent.

13. The cleaning formulation of claim 12, wherein the amine is selected from the group consisting of monoethanolamine and triethanolamine.

14. The cleaning formulation of claim 12, wherein the formulation contains 6 to 17% by weight chelating agent.

15. A cleaning formulation for post etch and plasma ashing cleaning of semiconductor wafers, consisting essentially of 10 to 17% by weight boric acid, 35 to 45% by weight of at least one amine, 32 to 45% by weight of water, 0 to 5% by weight glycol solvent, and 0 to 17% by weight chelating agent, wherein the chelating agent is selected from the group consisting of catechol, lactic acid, acetoacetamide, and salicylaldehyde.

16. A cleaning formulation for post etch and plasma ashing cleaning of semiconductor wafers, consisting of 10 to 17% by weight boric acid, 35 to 45% by weight of at least one amine, 32 to 45% by weight of water, 0 to 5% by weight glycol solvent, and 0 to 17% by weight chelating agent.

17. A cleaning formulation for post etch and plasma ashing cleaning of semiconductor wafers, consisting of 2 to 17% by weight boric acid, 35 to 70% by weight of at least one amine, 20 to 45% by weight of water, 0 to 5% by weight glycol solvent, and 0 to 17% by weight chelating agent.

18. A cleaning formulation as described in claim 17 including said glycol solvent, having a percentage by weight range not exceeding 5%.

19. A cleaning formulation as described in claim 17 including said chelating agent, having a percentage by weight range not exceeding 17%.

* * * * *